United States Patent [19]

Lee

[11] Patent Number: 5,113,373
[45] Date of Patent: May 12, 1992

[54] POWER CONTROL CIRCUIT

[75] Inventor: Douglas J. Lee, San Jose, Calif.

[73] Assignee: Advanced Micro Devices, Inc., Sunnyvale, Calif.

[21] Appl. No.: 563,061

[22] Filed: Aug. 6, 1990

[51] Int. Cl.$^5$ ............................................... G11C 7/00
[52] U.S. Cl. ................................. 365/227; 365/233.5; 365/233; 365/203
[58] Field of Search ..................... 365/233.5, 226, 227, 365/203, 233

[56] References Cited

U.S. PATENT DOCUMENTS

| | | | |
|---|---|---|---|
| 4,272,832 | 6/1981 | Ito | 365/233.5 |
| 4,701,889 | 10/1987 | Ando | 365/233.5 |
| 4,712,194 | 12/1987 | Yamaguchi et al. | 365/203 |
| 4,872,143 | 10/1989 | Sumi | 365/233.5 |

Primary Examiner—Joseph A. Popek
Attorney, Agent, or Firm—Benman & Collins

[57] ABSTRACT

A power control circuit which provides a means of limiting the active power required by a CMOS EPROM device. A "zero" power direct current (DC) quiescent mode of operation is achieved which enables the EPROM to remain in an active state with outputs active and inputs ready to accept data without power drain to the power supply or battery. On detection of an address transition or chip enable transition, a "power up" sequence occurs. The sense amplifiers, bias circuits and redundancy circuits are preconditioned to accept data. The sense amplifiers and data lines are equalized (precharged) and the bias circuits are powered up. Next, the sense amplifiers are allowed to accept new data from the EPROM core cell. Finally, the data is latched into an output buffer and all circuits are powered down to the "zero" DC power state. The next transition in address location will cause the process to repeat. The present invention enables an EPROM to remain in the active mode with lower overall power drain on a battery.

12 Claims, 4 Drawing Sheets

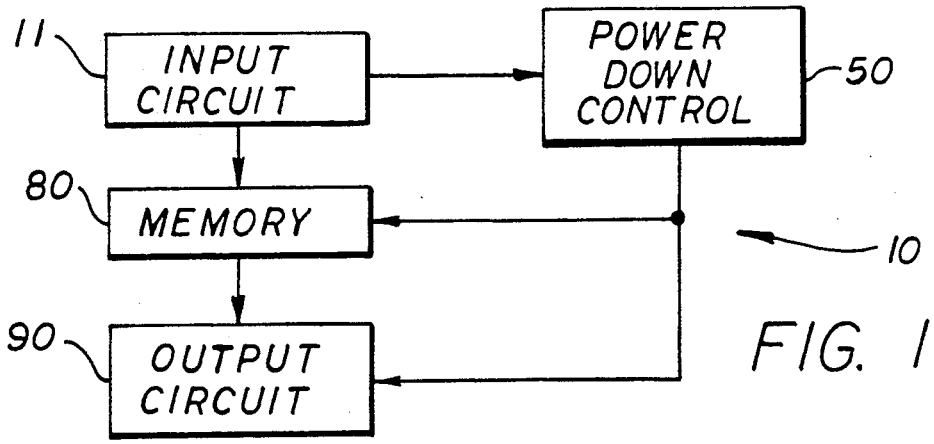
FIG. 1
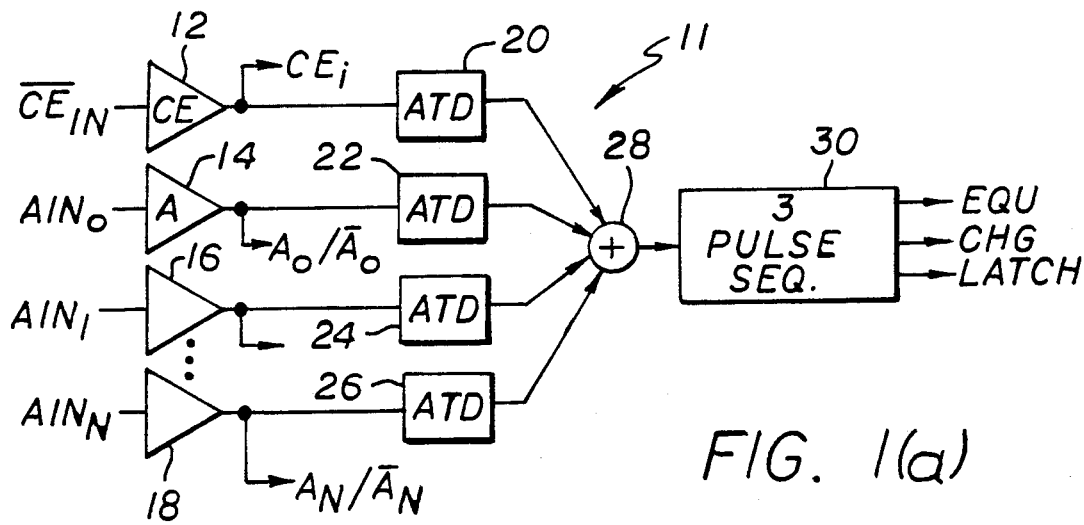
FIG. 1(a)
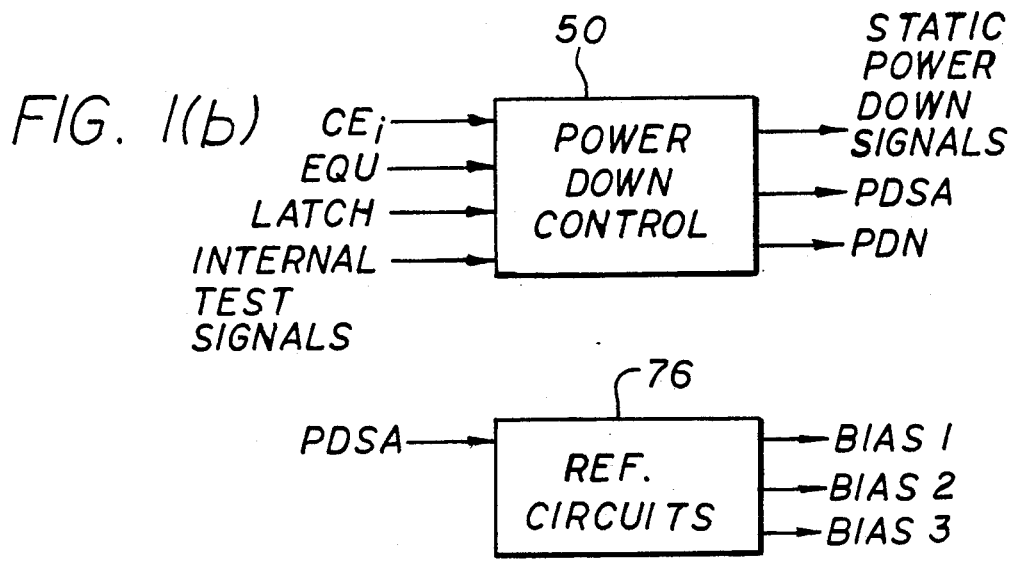
FIG. 1(b)
FIG. 1(c)

POWER CONTROL CIRCUIT

BACKGROUND OF THE INVENTION

1. Field of the Invention

The present invention relates to power control circuits. More specifically, the present invention relates to systems for conserving power in battery powered complementary metal-oxide semiconductor (CMOS) erasable programmable read-only memories (EPROM) and other devices.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

In cellular telephones, laptop computers and other battery operated systems requiring continuous active mode operation, power conservation is essential for maximum time between battery recharge or replacement cycles. In cellular telephony, for example, when the system is in a standby mode, scanners compare received codes with codes stored in memory to identify incoming calls. The memory is typically implemented as an EPROM which drains power in an active mode.

In laptop computers, a large number of memory cells must be ready to store data. Yet the activation of the memory cells drains power and limits the operating time of the system between charges.

Thus, for cellular telephones, laptop computers and other power critical systems, there is a need in the art for a power conservation system.

SUMMARY OF THE INVENTION

The need in the art is addressed by the power control circuit of the present invention. In a most general sense, the invention includes a sensing circuit for detecting the presence of an input signal and providing a first signal in response thereto. A logic circuit provides a first power control signal to the device in response to the first signal and a second power control signal to the device at a given time interval after the first power control signal.

In a specific application, the present invention provides a means of limiting the active power required by a CMOS EPROM device. A "zero" power direct current (DC) quiescent mode of operation is achieved which enables the EPROM to remain in an active state with outputs active and inputs ready to accept data without power drain to the power supply or battery.

On detection of an address transition or chip enable transition, a "power up" sequence occurs. The sense amplifiers, bias circuits and redundancy circuits are preconditioned to accept data. The sense amplifiers and data lines are equalized (precharged) and the bias circuits are powered up. Next, the sense amplifiers are allowed to accept new data from the EPROM core cell. Finally, the data is latched into an output buffer and all circuits are powered down to the "zero" DC power state. The next transition in address location will cause the process to repeat. The present invention enables an EPROM to remain in the active mode with lower overall power drain on a battery.

BRIEF DESCRIPTION OF THE DRAWINGS

FIGS. 1 shows the power control system of the present invention in connection with a conventional memory circuit.

FIG. 1(a) shows the input circuit and the triple pulse sequencer of an illustrative embodiment of the power control system of the present invention.

FIG. 1(b) is a block diagram showing the inputs and outputs of the power down control circuit of the present invention.

FIG. 1(c) is a block diagram showing the inputs and outputs of the reference circuit utilized in the present invention.

DESCRIPTION OF THE INVENTION

Figure 1D:
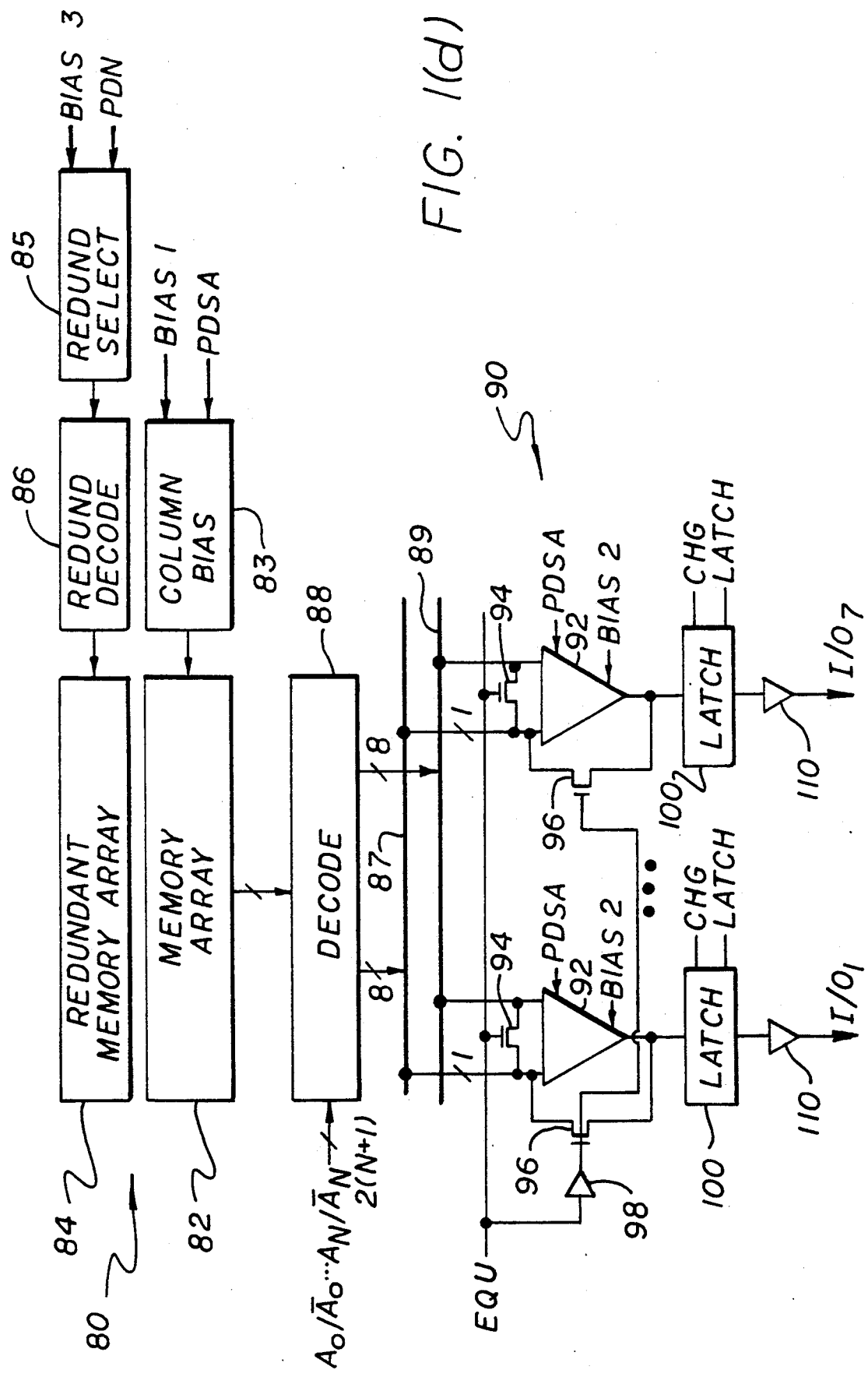
FIG. 1(d) is a block diagram showing the memory, decoder, sense amplifiers and latches and associated circuits to which power control circuit of the present invention is connected.

Illustrative embodiments and exemplary applications will now be described with reference to the accompanying drawings to disclose the advantageous teachings of the present invention.

FIGS. 1 shows the power control system of the present invention in connection with a conventional memory circuit. The system 10 includes an input circuit 11, a power down control circuit 50, a memory circuit 80 and an output circuit 90.

FIG. 1(a) shows the input circuit and the triple pulse sequencer of an illustrative embodiment of the power control system of the present invention. FIG. 1(b) is a block diagram showing the inputs and outputs of the power down control circuit of the present invention. FIG. 1(c) is a block diagram showing the inputs and outputs of the reference circuit utilized in the present invention. FIG. 1(d) is a block diagram showing the memory, decoder, sense amplifiers, latches and associated circuits to which power control circuit of the present invention is connected.

As shown in FIG. 1(a), the input circuit 11 includes a chip enable buffer 12 and a plurality of input buffers of which three are shown 14, 16 and 18. As is common in the art, each of the buffers is connected to a microprocessor or memory management circuit (not shown) for the purpose of accessing memory. The chip enable buffer 12 receives a chip enable signal $CE_{IN}'$. The system 10 is enabled by a low on the chip enable signal. The chip enable signal $CE_{IN}'$ is normally high when the system 10 is in the power down state. The inputs to the N address buffers, of which three are shown in FIG. 1(a), 14, 16 and 18, are $A_{IN0}$, $A_{IN1}$, and $A_{INn}$ respectively. These signals represent the input addresses for memory access.

The output of the chip enable buffer and each of the address buffers is provided to an associated address transition detector 20, 22, 24 and 26 respectively. In addition, the output of the chip enable buffer $CE_i$, the internal chip enable signal, is provided to the power down control circuit 50 while each of the address buffers are provided to a decoder as discussed more fully below. The address transition detectors generate pulses in response to the buffered input signals. The buffers and address transition detectors are of conventional design. One conventional implementation of an address transition detector includes a chain of inverters connected in parallel with a second chain of inverters which is shorted. The present invention is not limited to the use of this implementation of address transition detectors.

Figures 2, 3:
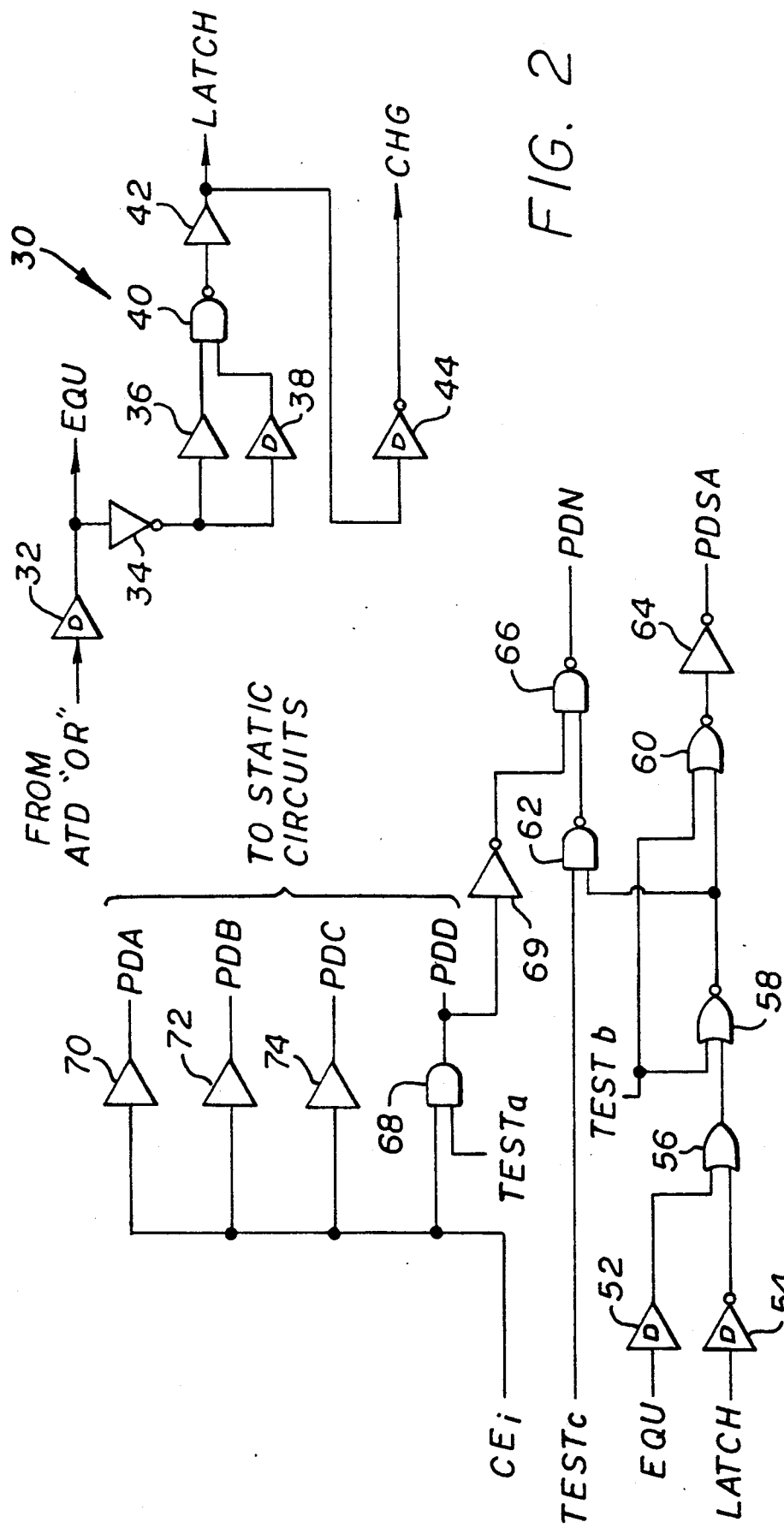
FIG. 2 is an illustrative implementation of the triple pulse sequencer of the present invention.
FIG. 3 shows an illustrative implementation of the power down control circuit of the present invention.

The outputs of each of the address transition detectors 20, 22, 24 and 26 are combined by an OR gate 28. The combined signals are input to a triple pulse sequencer 30. The triple pulse sequencer 30 generates control signals for the system 10. The implementation of the triple pulse sequencer 30, in accordance with the present teachings, is shown in FIG. 2. The sequencer 30 includes a delay buffer 32 which receives the input signal from the ATD or gate 28. The output of the delay buffer 32 provides an equalization signal "EQU". As commonly used in the art, the equalization signal equalizes signals that would ordinarily switch independently. For example, the equalization signal is used to short the inputs to sense amplifiers, discussed below, to enhance the speed of operation of the system and to insure proper operation thereof.

An inverter 34 also receives input from the delay circuit 32 and provides the inverted output thereof to an amplifier 36 and a delay inverter 38. These circuits provide complementary, albeit delayed, inputs to a NAND gate 40. The output of the NAND gate 40 is amplified by an amplifier 42 to provide the latch signal "LATCH". The output of the amplifier 42 is also input to a second delay inverter 44. The delay inverter 44 provides a charge signal "CHG" which is delayed and inverted relative to the LATCH signal. Thus, the EQU, CHG and LATCH signals shown in FIG. 1(a) are provided by the triple pulse sequencer 30.

As shown in FIG. 1(b), the internal chip enable signal $CE_i$, the equalization and latch signals, EQU and LATCH signals respectively and internal test signals are provided to the power down control circuit 50 which provides static power down control signals, a sense amplifier power down control signal "PDSA" and a redundant circuit power down control signal "PDN". (To disable certain "static" circuits, e.g., decode (deselected) circuits, test mode circuits, and programming circuits, when CE' is high, most voltages switch to zero volts.)

As shown in FIG. 3, in the illustrative embodiment, the power down control circuit 50 is implemented with discrete logic circuits and includes a delay amplifier 52 and a delay inverter 54. The delay amplifier 52 receives the equalization signal EQU while the delay inverter 54 receives the latch signal LATCH. The outputs of the delay amplifier 52 and the delay inverter 54 are input to an OR gate 56. The delayed ORed EQU and inverted LATCH signals are input to a NOR gate 58. The second input to the NOR gate 58 is one of three test signals $TEST_b$. The output of the NOR gate 58 is input to a second NOR gate 60 and a NAND gate 62. The test signal $TEST_b$ is also provided as a second input to the second NOR gate 60. The output of the second NOR gate 60 is inverted by an inverter 64 from which the sense amplifier power down control signal "PDSA" is provided. The second input to the NAND gate 62 is the third test signal $TEST_c$. The output of the NAND gate 62 is a first input to a second NAND gate 66. The second input to the second NAND gate 66 is provided by an AND gate 68 (through an inverter 69) which has the complement of the internal chip enable signal $CE_i$ and the first test signal $TEST_a$ as inputs. The output of the second NAND gate 66 provides a redundancy power down control signal "PDN". This signal is provided to redundancy select nodes within the system 10 (not shown) and controls the application of power applied to devices similar to CAM gates (content addressable memories) which divert inputs away from certain addresses.

The complement of the internal chip enable signal $CE_i$ is provided to several amplifiers 70, 72, and 74 which provide power down control signals PDA, PDB, and PDC to static circuits (not shown). A fourth power down control signal for static circuits PDD is provided by the output of the AND gate 68. In the illustrative embodiment, PDA goes to a decoder to deselect it output, e.g., bring the output of the decoder to zero volts; PDB is used to deselect "$TEST_a$", internal test mode; PDC deselects an internal oscillator used in the program mode; and PDD deselects address buffers so that the external bus draws no a.c. power.

The test signals are provided externally. The normal states of the test signals $TEST_a$, $TEST_b$ and $TEST_c$ are low into OR and NOR gates and high into AND and NAND gates to avoid interference with the normal operation of the system 10.

When the equalization signal is high or when the latch signal is low, the power down control signal to the sense amplifiers will go low allowing the sense amplifiers to be powered up. Thus, when the system 10 is equalizing or latching, power will be provided to the sense amplifiers. Further, when the internal chip enable signal $CE_i$ goes low, the latch path determines when the redundancy control signal PDN goes low. Thus, the redundancy control signal PDN follows the sense amplifier power down control signal PDSA except when disabled by test signals.

Hence, the power down control circuit 50 of the present invention provides the PDSA, PDN, and static power down control signals illustrated in FIG. 1(b).

FIG. 1(c) is a block diagram showing the inputs and outputs of the reference circuit utilized in the present invention. The reference circuit 76 generates 3 reference voltages $BIAS_1$ $BIAS_2$ $BIAS_3$ on receipt of the PDSA signal. The bias voltages provided by the reference circuit 76 are used to control the application of power to the memory and output circuits as discussed below. Although the details of the reference circuit 76 are not shown and not critical to the invention, the reference circuit is included here to illustrate that as a power draining circuit (typically analog), the reference circuit 76 may be powered down by the present invention in accordance with the present teachings.

The memory and output circuits 80 and 90 respectively, are shown combined in FIG. 1(d). The memory circuit 80 includes a memory array 82 and a redundant memory array 84. A column bias circuit 83 sets up voltages on reference lines and data lines in the memory array 82 in response to the first reference voltage $BIAS_1$ and the PDSA signal. The third reference voltage $BIAS_3$ and the PDN signal are provided to a redundancy select circuit 85. The conventional redundancy select circuit 85 feeds a conventional redundancy decode circuit 86. The select and decode circuits access the redundant memory array 84. Once again, the details of the redundancy control circuits are not shown nor necessary inasmuch as these circuits are included here to illustrate that the present invention may be used to control the application of power thereto as well. On receipt of addresses from the input buffers, a conventional decoder 88 accesses the memory arrays and extracts the data stored therein at the desired input addresses. The extracted data and reference data are provided on data and reference buses 87 and 89 respectively.

The output circuit 90 includes a plurality of sense amplifiers 92, one for each bit of output data. Thus, each sense amplifier 92 has a first data input line connected to the data bus 87 and a second data line connected to the reference bus 89. The sense amplifiers detect whether each memory cell is in a high or low state. The sense amplifiers 92 are differential amplifiers. That is, the signal on the reference bus 89 and the second data line is compared to the signal on the data bus 87 and the first data input line by each sense amplifier 92. A first shorting transistor 94 is connected across the inputs of each sense amplifier 92. The transistors 94 short the input lines on receipt of the equalization pulse EQU. A second shorting transistor 96 is connected between the data input and the output of each sense amplifier. The second shorting transistor 96 also responds to the equalization pulse via an amplifier 98.

As is common in the art, the second reference voltage $BIAS_2$ is used to power each sense amplifier. In accordance with the present teaching, the sense amplifier power control signal PDSA is also provided to each sense amplifier. The PDSA input is provided by the power down control logic 50 as discussed above and is connected to the local bias terminal of the sense amplifier. Thus, when the PDSA signal is high the sense amplifiers 92 are powered down as discussed more fully below. The power down deactivation of the sense amplifiers 92 and the bias circuits are a particularly advantageous feature of the present invention inasmuch as these circuits would ordinarily continue to draw power in a system design in accordance with conventional teachings.

Figure 4:
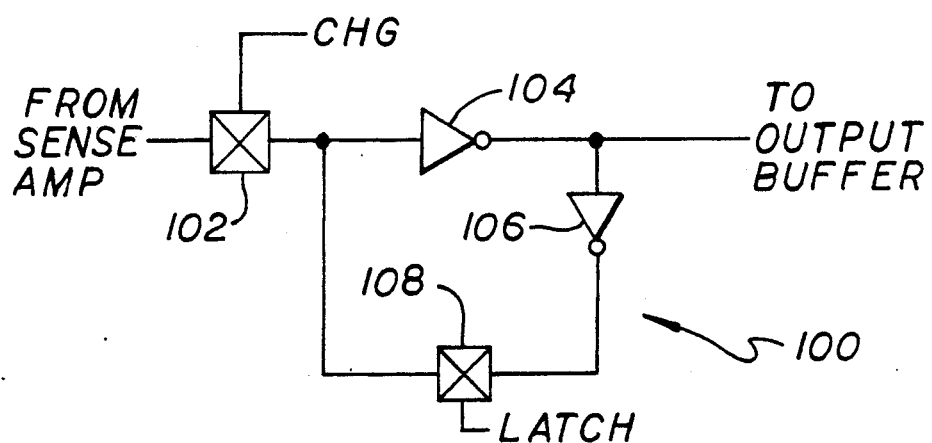
FIG. 4 shows an illustrative implementation of the latch circuit utilized in the present invention.

The differential output of each sense amplifier is provided to an associated latch circuit 100. Each latch 100 is controlled by the CHG and LATCH signals from the power down control circuit 50. FIG. 4 shows an illustrative implementation of the latch circuit 100 utilized in the present invention. The latch circuit 100 includes a first transfer gate 102 which receives input from a sense amplifier 92. The first transfer gate 102 is controlled by the CHG signal from the power down control circuit 50. The output of the first transfer gate 102 is provided to a first inverter 104. The output of the first inverter 104 provides the output of the latch and is input to a second inverter 106. The output of the second inverter 106 is input to a second transfer gate 108. The output of the second transfer gate 108 is connected to the input to the first inverter 104 to complete a feedback loop which those skilled in the art will recognize as a latch. The second transfer gate is controlled by the LATCH signal from the power down control circuit 50. Thus, the latch 100 is enabled by the CHG signal and latched by the LATCH signal.

As illustrated in FIG. 1(d), the outputs of the latches 100 are provided to output buffers 110 as is common in the art.

Figure 5:
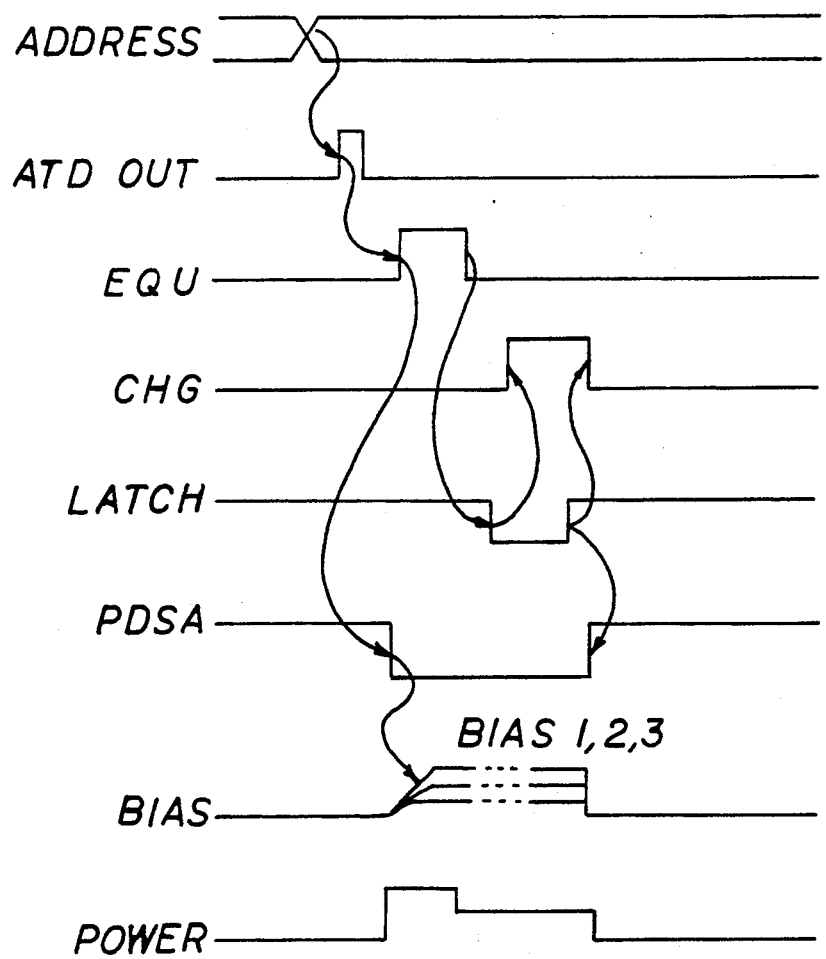
FIG. 5 is a timing diagram which illustrates the operation of the present invention.

FIG. 5 is a timing diagram which illustrates the operation of the present invention. When an address transition occurs at the input of any of the input buffers, the output of the OR gate 28 of FIG. 1(a) goes high. (See FIG. 1(a)) This causes the normally low EQU signal from the triple pulse sequencer 30 to go high. (See FIG. 2.) After some delay, this causes the PDSA signal from the power down control circuit 50 to go high. (See FIG. 3.) When PDSA goes high, the reference voltages are generated $BIAS_1$, $BIAS_2$ and $BIAS_3$ to power up the memory arrays and, with the PDSA signal, to power up the sense amplifiers 92. (See FIGS. 1(c) and 1(d). In the triple pulse sequencer 30, (FIG. 2), the high EQU pulse is inverted by the inverter 34 and applied directly to the noninverted input of the NAND gate 40. Initially, the second input to the NAND gate 40 is also low due to the inherent delay of the inverter 38. This places a zero on both inputs of the NAND gate 40 and the output of the NAND gate 40 and hence the LATCH signal remain high. Eventually, the output of the inverter 38 goes high. After a delay, the output of the delay amplifier 32 goes low and the EQU signal goes low. When the EQU signal goes low, a high is placed in the first input to the NAND gate 40. With a high from the delay inverter 38, the output of the NAND gate 40 and the LATCH signal go low. A short time after the LATCH signal goes low, the CHG signal goes high. This is shown in the timing diagram of FIG. 5 and allows the latches 100 to receive new data. (See FIG. 4). Eventually the pulse propagates through the delay inverter 38 and the latch and charge signal return to the normal states thereof and the new data is latched into the output buffers. As shown in FIG. 3, when the LATCH signal goes high and the EQU signal is low, the PDSA signal goes high and the sense amplifiers and bias circuits go to a power down state. (In the preferred embodiment, the EQU and LATCH signals overlap to ensure that PDSA will not go high in between the transitions of same). The power consumption of the system 10 is minimized as illustrated in FIG. 5. Nonetheless, the system 10 remains active and can respond immediately to the next address change (query) for data stored within the memory array 82.

Note that the address transition detectors would not need to be powered down if implemented in CMOS technology. The sequencer 30 and the power down control circuits would not need to be powered down if implemented as logic circuits as shown in the illustrative preferred embodiment.

Note also that the present invention differs from conventional systems in that in conventional systems, the latches latch only during the EQU pulse to keep the outputs from going to an indeterminate state while the inputs are being equalized. In the present invention, the latches are normally latched and turned off only during the charging state, that is, during the EQU and LATCH states.

Thus, the present invention has been described herein with reference to a particular embodiment for a particular application. Those having ordinary skill in the art and access to the present teachings will recognize additional modifications applications and embodiments within the scope thereof. For example, the invention is not limited to use with a memory circuit. Any power consuming device for which intermittent operation is desired may benefit from the teaching provided herein. Further, the invention is not limited to the implementations shown. The sequencer and power down control circuits may be designed to suit a particular application as will be appreciated by those skilled in the art.

It is therefore intended by the appended claims to cover any and all such applications, modifications and embodiments within the scope of the present invention. Accordingly,

What is claimed is:

1. A power control circuit for a device having a latching circuit comprising:
   sensing means for detecting an address transition signal to said device and providing a first signal in response thereto and
   sequencer means in communication with said sensing means for providing a plurality of control signals in response to said first signal including an equalization signal for equalizing signals within said device, a charge signal for enabling said latching circuit and a latch signal for commanding said latching circuit to latch, whereby said plurality of control signals minimize power consumption within said device.

2. The power control circuit of claim 1 further including logic means for providing a first power control signal to said device in response to said first signal and a second power control signal to said device at a given time interval after said first power control signal.

3. The power control circuit of claim 2 wherein said first power control signal is a power up signal.

4. The power control circuit of claim 3 wherein sad power up signal is generated by said address transition signal and a high logic level on said equalization signal and on a sense amplifier power down control signal.

5. The power control circuit of claim 4 wherein said second power control signal is a power down signal.

6. The power control circuit of claim 5 wherein said power down signal is generated by a low logic level on said equalization signal and a high logic level on said latch signal and on said sense amplifier power down control signal.

7. A power control circuit for a memory device including bias circuits, sense amplifiers and a latching circuit, comprising:
   sensing means for detecting an address transition signal at the input of said memory device and providing a first signal in response thereto;
   sequencer means in communication with said sensing means for providing a plurality of control signals in response to said first signal including an equalization signal for equalizing signals within said memory device, a charge signal for enabling said latching circuit and a latch signal for commanding said latching circuit to latch; and
   logic means for providing a first power control signal to said memory device in response to said equalization signal and a second power control signal to said device at a given time interval after said first power control signal for minimizing power consumption within said memory device.

8. The invention of claim 6 wherein said first power control signal is a power up signal.

9. The invention of claim 7 wherein said second power control signal is a power down signal.

10. The power control circuit of claim 9 wherein said power down signal is generated by a low logic level on said equalization signal and a high logic level on said latch signal and on said sense amplifier power down control signal.

11. The power control circuit of claim 8 wherein said power up signal is generated by said address transition signal and a high logic level on said equalization signal and on a sense amplifier power down control signal.

12. A method for controlling power applied to a device having a latching circuit including the steps of:
   detecting an address transition signal to said device and providing a first signal in response thereto;
   providing a plurality of control signals in response to said first signal including an equalization signal for equalizing signals within said device, a charge signal for enabling said latching circuit and a latch signal for commanding said latching circuit to latch; and
   providing a power up controls signal to said device in response to said first signal and a power down control signal to said device at a given time interval after said power up control signal for minimizing power consumption in said device.

* * * * *